United States Patent
Lee

(10) Patent No.: US 7,298,666 B2
(45) Date of Patent: Nov. 20, 2007

(54) DEVICE FOR DISTRIBUTING INPUT DATA FOR MEMORY DEVICE

(75) Inventor: Chang Hyuk Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/175,412

(22) Filed: Jul. 6, 2005

(65) Prior Publication Data
US 2006/0245271 A1    Nov. 2, 2006

(30) Foreign Application Priority Data
Apr. 27, 2005    (KR) ...................... 10-2005-0034970

(51) Int. Cl.
*G11C 7/10* (2006.01)
*G11C 8/10* (2006.01)
(52) U.S. Cl. ............. 365/230.06; 365/191; 365/189.08
(58) Field of Classification Search ........... 365/189.05, 365/221, 219
See application file for complete search history.

(56) References Cited
U.S. PATENT DOCUMENTS
6,115,321 A    9/2000   Koelling et al.
6,762,972 B2 *  7/2004   La .............................. 365/233
2006/0161743 A1*  7/2006   Fekih-Romdhane et al. ..... 711/154

FOREIGN PATENT DOCUMENTS
KR    102003 0008702    1/2003
KR    102003 0061217    7/2003
KR    102004 0063985    7/2004

* cited by examiner

*Primary Examiner*—Amir Zarabian
*Assistant Examiner*—Michael Weinberg
(74) *Attorney, Agent, or Firm*—Ladas & Parry LLP

(57) ABSTRACT

Disclosed is an input data distribution device for a memory device, the input data distribution device comprising: a decoding section for receiving a starting column address applied when a write command is activated; and N number of switching sections each of which receives N bits of data applied sequentially through one data pin after the write command is activated, wherein each of the switching sections exclusively outputs one bit from among the N bits of data by using an output signal of the decoding section and a signal for determining a burst type.

4 Claims, 5 Drawing Sheets

DEVICE FOR DISTRIBUTING INPUT DATA FOR MEMORY DEVICE

BACKGROUND OF THE INVENTION

1. Field of the Invention

The present invention relates to a data distribution device for a memory device, and more particularly to a data distribution device which determines a scheme for distributing data applied when a write command is activated.

2. Description of the Prior Art

As generally known in the art, a synchronous memory device (such as a DDR SDRAM, a DDR2 SDRAM, etc.) receives and outputs data in synchronization with a clock signal. For example, in the case of a write operation in the DDR2 SDRAM, a write command and a column address are applied in synchronization with the rising edge of a clock signal, first data and second data are inputted in synchronization with the rising edge and the falling edge of the next clock signal, respectively, and then in a similar way, data as long as a burst length are continuously applied in synchronization with the rising edges and the falling edges of the clock signals consecutively following. Data continuously-applied as described above are inputted through each of data pins. For convenience of description, it is assumed that a memory device discussed in this document has a burst length of '4'.

Generally, in a write operation, 4-bit data (e.g., din0r<0>, din0f<0>, din1r<0> and din1f<0>), which have been sequentially (serially) applied through a specific data pin in synchronization with rising and falling edges of clock signals, are stored in four registers in one-to-one correspondence, and then are inputted to four input lines in one-to-one correspondence in synchronization with a clock signal. That is, the four registers function as a serial-to-parallel converter. The data din0r<0>, din0f<0>, din1r<0> and din1f<0> applied to the four input lines are transferred to four global input/output lines, respectively, and are then stored in a memory cell array. Herein, the data din0r<0>, din0f<0>, din1r<0> and din1f<0> represent data applied sequentially through a data pin DQ0 in synchronization with rising and falling edges of clock signals.

Meanwhile, before the four pieces of data are transferred to the global input/output lines, an operation of determining the sequence and positions for storing the four pieces of data in the memory cell array is performed. In this document, this operation is called 'data distribution operation' for convenience of description. Generally, the data distribution operation is determined according to a burst type and a starting column address. Herein, the burst type includes a sequential mode and an interleave mode, which are modes for determining a data application sequence. A starting column address used in this document represents the lowest two bits (A1 and A0) of a column address, which is also defined in the JEDEC standard. As generally known in the art, the above-mentioned four global input/output lines corresponds to the decoding values 0, 1, 2 and 3 of the starting column address, respectively. Therefore, data are transferred to the four global input/output lines in one-to-one correspondence according to the starting column address and the burst type.

Table 1 shows a data access sequence according to burst lengths, starting column addresses and burst types.

TABLE 1

| Burst Length | Starting Column Address | | | Access Sequence | |
|---|---|---|---|---|---|
| | | | | Sequential Type | Interleave Type |
| 2 | A0 | | | | |
| | 0 | | | 0-1 | 0-1 |
| | 1 | | | 1-0 | 1-0 |
| 4 | A1 | A0 | | | |
| | 0 | 0 | | 0-1-2-3 | 0-1-2-3 |
| | 0 | 1 | | 1-2-3-0 | 1-0-3-2 |
| | 1 | 0 | | 2-3-0-1 | 2-3-0-1 |
| | 1 | 1 | | 3-0-1-2 | 3-2-1-0 |
| 8 | A2 | A1 | A0 | | |
| | 0 | 0 | 0 | 0-1-2-3-4-5-6-7 | 0-1-2-3-4-5-6-7 |
| | 0 | 0 | 1 | 1-2-3-4-5-6-7-0 | 1-0-3-2-5-4-7-6 |
| | 0 | 1 | 0 | 2-3-4-5-6-7-0-1 | 2-3-0-1-6-7-4-5 |
| | 0 | 1 | 1 | 3-4-5-6-7-0-1-2 | 3-2-1-0-7-6-5-4 |
| | 1 | 0 | 0 | 4-5-6-7-0-1-2-3 | 4-5-6-7-0-1-2-3 |
| | 1 | 0 | 1 | 5-6-7-0-1-2-3-4 | 5-4-7-6-1-0-3-2 |
| | 1 | 1 | 0 | 6-7-0-1-2-3-4-5 | 6-7-4-5-2-3-0-1 |
| | 1 | 1 | 1 | 7-0-1-2-3-4-5-6 | 7-6-5-4-3-2-1-0 |

FIG. 1 is a block diagram for explaining a conventional data distribution scheme. For reference, a 16-bit control signal ctrl<0:15>, which is applied to each latch section to control an operation of distributing input data, functions to determine a distribution sequence of 4-bit input data according to burst types and starting column addresses.

As shown in FIG. 1, 4-bit data din0r<0>, din0f<0>, din1r<0> and din1f<0> inputted sequentially through a data pin DQ0 are applied to a latch section 100. The latch section 100 transfers the data din0r<0>, din0f<0>, din1r<0> and din1f<0> to global input/output lines gio_0_0, gio_1_0, gio_2_0 and gio_3_0 in one-to-one correspondence according to logic levels of the 16-bit control signal ctrl<0:15>.

4-bit data din0r<1>, din0f<1>, din1r<1> and din1f<1> inputted sequentially through a data pin DQ1 are applied to a latch section 101. The latch section 101 transfers the data din0r<1>, din0f<1>, din1r<1> and din1f<1> to global input/output lines gio_0_1, gio_1_1, gio_2_1 and gio_3_1 in one-to-one correspondence according to logic levels of the 16-bit control signal ctrl<0:15>.

4-bit data din0r<2>, din0f<2>, din1r<2> and din1f<2> inputted sequentially through a data pin DQ2 are applied to a latch section 102. The latch section 102 transfers the data din0r<2>, din0f<2>, din1r<2> and din1f<2> to global input/output lines gio_0_2, gio_1_2, gio_2_2 and gio_3_2 in one-to-one correspondence according to logic levels of the 16-bit control signal ctrl<0:15>.

4-bit data din0r<3>, din0f<3>, din1r<3> and din1f<3> inputted sequentially through a data pin DQ3 are applied to a latch section 103. The latch section 103 transfers the data din0r<3>, din0f<3>, din1r<3> and din1f<3> to global input/output lines gio_0_3, gio_1_3, gio_2_3 and gio_3_3 in one-to-one correspondence according to logic levels of the 16-bit control signal ctrl<0:15>.

As shown in FIG. 1, according to the conventional data distribution device, each latch section receives a 16-bit control signal through 16 number of control lines in order to perform a distribution operation for 4-bit data applied to each latch section. For this reason, the conventional data distribution device has a problem in that a large layout area is required for disposition of control lines.

SUMMARY OF THE INVENTION

Accordingly, the present invention has been made to solve the above-mentioned problems occurring in the prior art, and an object of the present invention is to provide a data distribution device for a memory device which can reduce the number of control lines required for a control signal to perform a data distribution operation, thereby reducing the layout area for disposition of the control lines.

In order to accomplish this object, there is provided an input data distribution device for a memory device, the input data distribution device comprising: a decoding section for receiving a starting column address applied when a write command is activated; and N number of switching sections each of which receives N bits of data applied sequentially through one data pin after the write command is activated, wherein each of the switching sections exclusively outputs one bit from among the N bits of data by using an output signal of the decoding section and a signal for determining a burst type.

Herein, output nodes of the switching sections one-to-one correspond to global input/output lines of the memory device, and a disposition sequence of the N-bit data transferred to the global input/output lines is determined by a combination of the output signal of the decoding section and the signal for determining a burst type.

In accordance with another aspect of the present invention, there is provided an input data distribution device for a memory device, the input data distribution device comprising: a decoding section for receiving a starting column address applied when a write command is activated; a plurality of control sections which use an output signal of the decoding section and a signal for determining a burst type as control signals; and a plurality of first switching sections and second switching sections each of which receives N bits of data sequentially applied as long as a burst length through one data pin after the write command is activated, wherein each of the first switching sections exclusively outputs one bit from among the N-bits of data in response to an output signal of the decoding section, and each of the second switching sections exclusively outputs one bit from among the N bits of data in response to output signals of the decoding section and the control section.

Herein, output nodes of the first and second switching sections one-to-one correspond to global input/output lines of the memory device, and a disposition sequence of the N-bit data transferred to the global input/output lines is determined by a combination of the output signal of the decoding section and the signal for determining a burst type. In addition, data outputted from the first switching sections are determined by the starting column address, and data outputted from the second switching sections are determined by the starting column address and the burst type.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
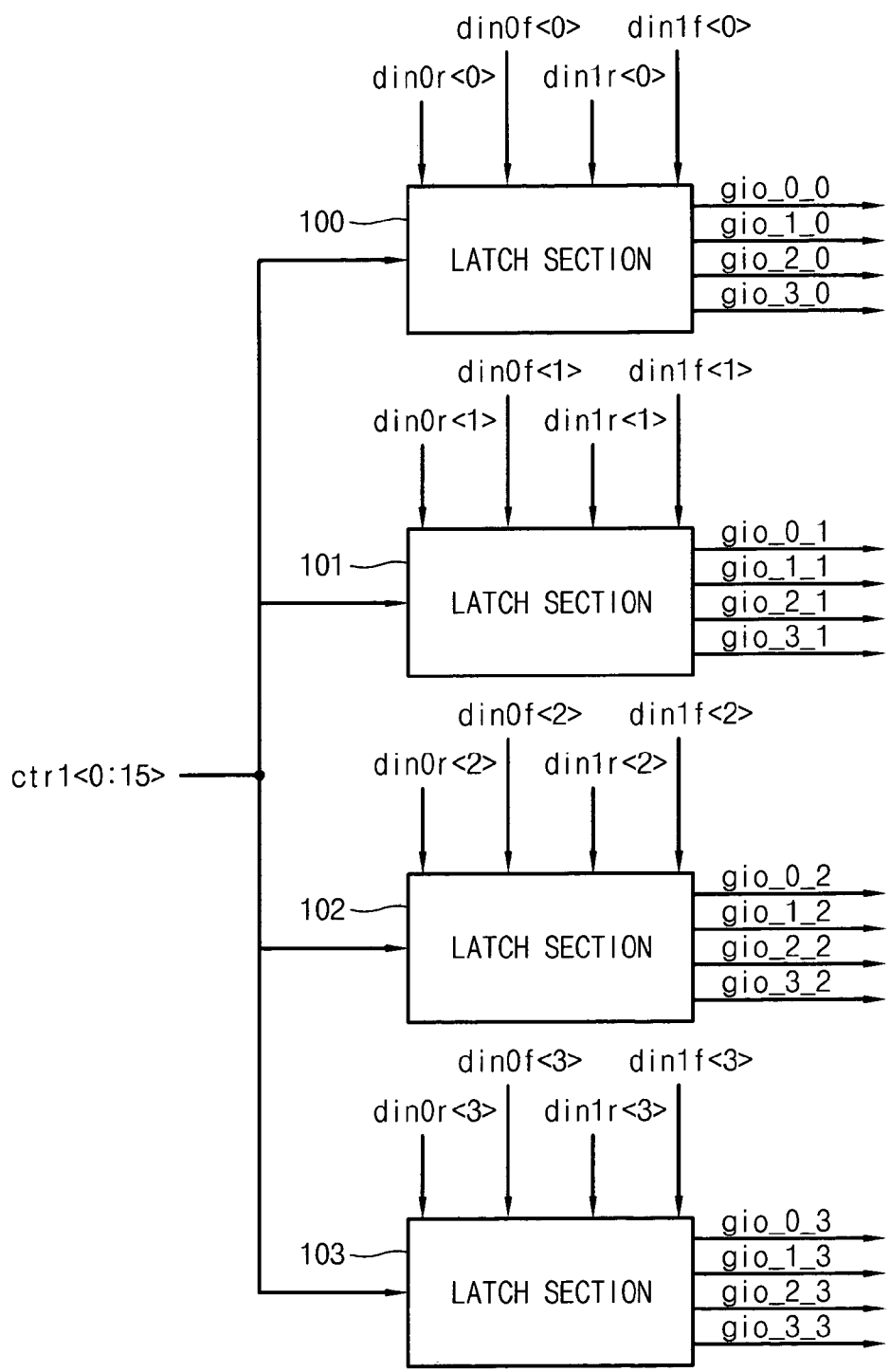
FIG. 1 is a block diagram for explaining a conventional data distribution scheme.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
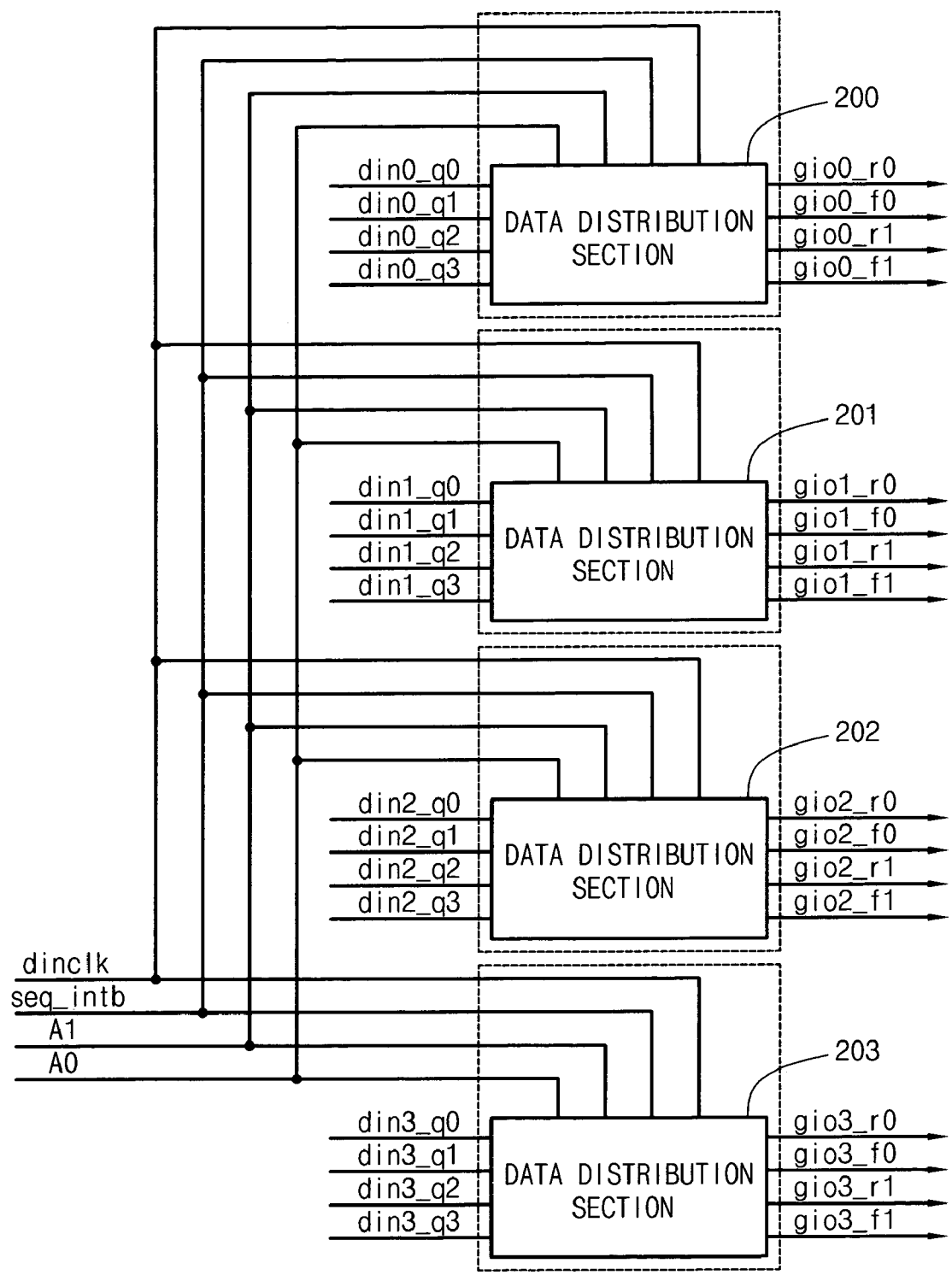
FIG. 2 is a block diagram for explaining a data distribution scheme according to an embodiment of the present invention.

FIG. 2 is a block diagram for explaining a data distribution scheme according to an embodiment of the present invention. For reference, although FIG. 2 shows a X4 mode as an example, those skilled in the art will appreciate that the concept of the present invention will be identically applied to X8 and X16 modes.

Referring to FIG. 2, after a data distribution section 200 receives 4-bit data din0_q0, din0_q1, din0_q2 and din0_q3 applied through a data pin DQ0, and the data distribution section 200 determines a transmission sequence of the 4-bit data to be transferred in one-to-one correspondence to global input/output lines gio0_r0, gio0_f0, gio0_r1 and gio0_f1 according to logic levels of 4-bit control signals dinclk, seq_intb, A1 and A0.

After a data distribution section 201 receives 4-bit data din1_q0, din1_q1, din1_q2 and din1_q3 applied through a data pin DQ1, and the data distribution section 201 determines a transmission sequence of the 4-bit data to be transferred in one-to-one correspondence to global input/output lines gio1_r0, gio1_f0, gio1_r1 and gio1_f1 according to logic levels of 4-bit control signals dinclk, seq_intb, A1 and A0.

After a data distribution section 202 receives 4-bit data din2_q0, din2_q1, din2_q2 and din2_q3 applied through a data pin DQ2, and the data distribution section 202 determines a transmission sequence of the 4-bit data to be transferred in one-to-one correspondence to global input/output lines gio2_r0, gio2_f0, gio2_r1 and gio2_f1 according to logic levels of 4-bit control signals dinclk, seq_intb, A1 and A0.

After a data distribution section 203 receives 4-bit data din3_q0, din3_q1, din3_q2 and din3_q3 applied through a data pin DQ3, and the data distribution section 203 determines a transmission sequence of the 4-bit data to be transferred in one-to-one correspondence to global input/output lines gio3_r0, gio3_f0, gio3_r1 and gio3_f1 according to logic levels of 4-bit control signals dinclk, seq_intb, A1 and A0.

Referring to FIG. 2, it can be understood that the data distribution device according to the present invention uses only four control signals, thereby having a more efficient layout than the conventional device using a 16-bit control signal.

Hereinafter, how to function as a data distribution section using only a 4-bit control signal will be described in detail.

Figure 3:
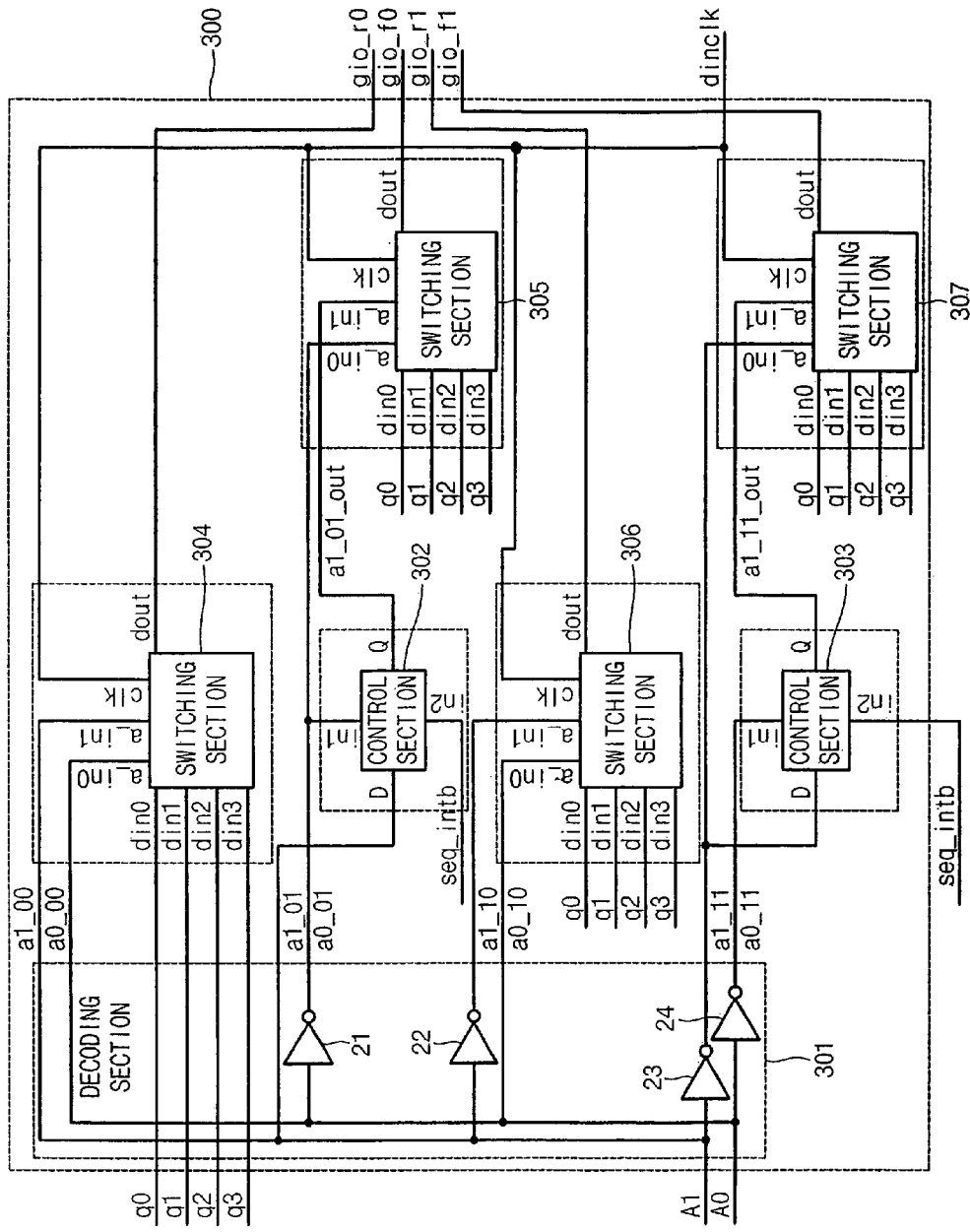
FIG. 3 is a block diagram illustrating a configuration of a data distribution section shown in FIG. 2 according to an embodiment of the present invention.

FIG. 3 is a block diagram illustrating the detailed configuration of a data distribution section shown in FIG. 2 according to an embodiment of the present invention. Herein, reference numeral '300' represents one of data distribution sections shown in FIG. 2. For reference, data q0, q1, q2 and q3 in FIG. 3 correspond to 4-bit data applied to each data distribution section in FIG. 2, and global input/output lines gio_r0, gio_f0, gio_r1 and gio_f1 in FIG. 3 correspond to global input/output lines of each data distribution section in FIG. 2.

As shown in FIG. 3, the data distribution section 300 includes a decoding section 301, control sections 302 and 303, and switching sections 304, 305, 306 and 307.

The decoding section 301 receives a starting column address (A0, A1), and outputs first decoding signals a1_00 and a0_00, second decoding signals a1_01 and a0_01, third decoding signals a1_10 and a0_10, and fourth decoding signals a1_11 and a0_11.

As shown in this drawing, the logic levels of the first decoding signals a1_00 and a0_00 are equal to those of (A1, A0), the logic levels of the second decoding signals a1_01 and a0_01 are equal to those of (A1, /A0), the logic levels of the third decoding signals a1_10 and a0_10 are equal to those of (/A1, A0), and the logic levels of the fourth decoding signals a1_11 and a0_11 are equal to those of (/A1, /A0).

A burst type determination signal seq_intb and the signal a0_01, which are applied to the control section 302, are used as control signals. When signal a1_01 is applied through an input node D of the control section 302, the control section 302 outputs either a signal having a logic level equal to that of the signal a1_01 or a signal having a logic level opposite to (i.e., a logic level inverted from) that of the signal a1_01, through its output node Q, according to logical levels of the control signals a0_01 and seq_intb.

Similarly, a burst type determination seq_intb and a signal a0_11 applied to the control section 303 are used also as control signals. When signal a1_11 applied through an input node D of the control section 303, the control section 303 outputs either a signal having a logic level equal to that of the signal a1_11 or a signal having a logic level opposite to (i.e., a logic level inverted from) that of the signal a1_11, through its output node Q, according to logical levels of the control signals a0_11 and seq_intb.

Figure 4:
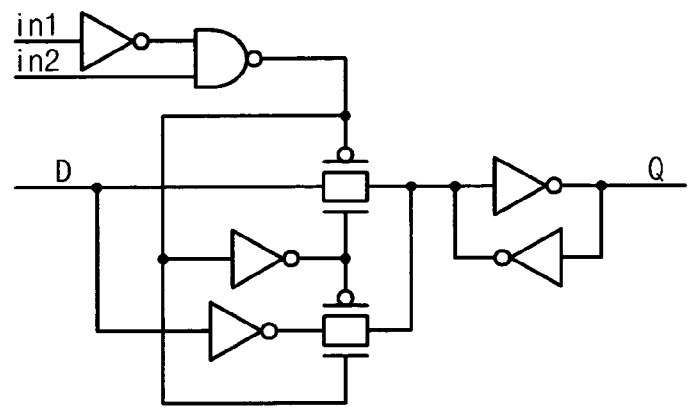
FIG. 4 is a circuit diagram illustrating a control section shown in FIG. 3.

For reference, the burst type determination signal seq_intb applied to the control sections 302 and 303 is a signal to determine whether the burst type is a sequential type or an interleave type. In this document, a burst type determination signal seq_intb having a high level represents the sequential type, and a burst type determination signal seq_intb having a low level represents the interleave type. As shown in FIG. 4 which illustrates a detailed configuration of the control section 302 or 303, a level of a signal outputted from each of the control sections 302 and 303 is determined depending on whether the burst type is the sequential type or the interleave type.

Each of the switching sections 304, 305, 306 and 307 functions as a multiplexer which selects and outputs one of the input data q0, q1, q2 and q3. Herein, the input data q0 to q3 inputted commonly to the switching sections represents 4-bit data inputted sequentially through one data pin. Therefore, in the case of X4 as shown in FIG. 2, it should be noted that three circuits equal to that shown in FIG. 3 are further included.

The switching section 304 selects one of the input data q0 to q3 and transfers the selected datum to a global input/output line gio_r0. In this case, the datum selected and outputted by the switching section 304 is determined by signals a1_00 and a0_00. The switching section 304 operates in synchronization with a clock signal dinclk. The switching sections 305, 306 and 307 described later in this document also operate in synchronization with the clock signal dinclk.

The switching section 305 selects one of the input data q0 to q3 and transfers the selected datum to a global input/output line gio_f0. In this case, the datum selected and outputted by the switching section 305 is determined by a signal a0_01 and an output signal a1_01_out of the control section 302.

The switching section 306 selects one of the input data q0 to q3 and transfers the selected datum to a global input/output line gio_r1. In this case, the datum selected and outputted by the switching section 306 is determined by signals a1_10 and a0_10.

The switching section 307 selects one of the input data q0 to q3 and transfers the selected datum to a global input/output line gio_f1. In this case, the datum selected and outputted by the switching section 307 is determined by a signal a1_11 and an output signal a1_11_out of the control section 303.

The operation of the circuit shown in FIG. 3 will now be described in detail.

According to an embodiment, it is assumed that the input data (q0, q1, q2, q3) are (1, 0, 1, 1), the burst type is the sequential type, and a starting column address (A1, A0) is (1,0).

In this case, as shown in Table 1, the starting column address (A1, A0) has a value of '2', and a data access sequence is a sequence of 2, 3, 0 and 1. Therefore, the switching section 304 selects and outputs 'q2', the switching section 305 selects and outputs 'q3', the switching section 306 selects and outputs 'q0', and the switching section 307 selects and outputs 'q1'. Accordingly, data q2, q3, q0 and q1 are transferred to the global input/output lines gio_r0, gio_f0, gio_r1 and gio_f1, respectively. That is, data applied to the global input/output lines gio_r0, gio_f0, gio_r1 and gio_f1 are (1,1,1,0), respectively.

According to another embodiment, it is assumed that the input data (q0,q1,q2,q3) are (1,0,1,1), the burst type is the interleave type, and a starting column address (A1, A0) is (1,0).

In this case, as shown in Table 1, a data access sequence is equal to that in the case of the sequential type. Therefore, data q2, q3, q0 and q1 are transferred to the global input/output lines gio_r0, gio_f0, gio_r1 and gio_f1, respectively. That is, data applied to the global input/output lines gio_r0, gio_f0, gio_r1 and gio_f1 are (1,1,1,0), respectively.

According to still another embodiment, it is assumed that the input data (q0,q1,q2,q3) are (1,0,0,1), the burst type is the sequential type, and a starting column address (A1, A0) is (0,1). In this case, data q1, q2, q3 and q0 are transferred to the global input/output lines gio_r0, gio_f0, gio_r1 and gio_f1, respectively. That is, data applied to the global input/output lines gio_r0, gio_f0, gio_r1 and gio_f1 are (0,0,1,1), respectively.

In contrast, when the input data (q0,q1,q2,q3) are (1,0,0,1), the burst type is the interleave type and a starting column address (A1, A0) is (0,1), data q1, q0, q3 and q2 are transferred to the global input/output lines gio_r0, gio_f0, gio_r1 and gio_f1, respectively. That is, data applied to the global input/output lines gio_r0, gio_f0, gio_r1 and gio_f1 are (0,1,1,0), respectively.

FIG. 4 is a circuit diagram illustrating a control section 302 or 303 shown in FIG. 3.

As shown in FIG. 4, the control section outputs either a signal having the logic level equal to that of an input signal (e.g., a1_01 or a1_11 in FIG. 3) applied to its input node D or a signal having the inverted logic level of the input signal (e.g., a1_01 or a1_11 in FIG. 3) through its output node Q, depending on the logic levels of control signals in1 and in2. The reason will be described with reference to table 1. Referring to Table 1, when a burst length is '4' and a starting column address is '0', data are distributed in a sequence (access sequence) of 0, 1, 2 and 3 regardless of burst types. Also, when a burst length is '4' and a starting column address is '2', the data are distributed in a sequence of 2, 3, 0 and 1 regardless of burst types.

However, when a burst length is '4' and a starting column address is '1', the data are distributed in a sequence of 1, 2, 3 and 0 in the case of the sequential type, and the data are distributed in a sequence of 1, 0, 3 and 2 in the case of the interleave type. It can be understood in this case that the data distribution sequence changes depending on the burst types. Similarly, when a burst length is '4' and a starting column address is '3', the data distributed in a sequence of 3, 0, 1 and 2 in the case of the sequential type, and the data are distributed in a sequence of 3, 2, 1 and 0 in the case of the interleave type. That is it can be understood in this case that the data distribution sequence changes depending on the burst types. As described above, the control section is a circuit for compensating a data distribution sequence which changes depending on burst types. For reference, in FIG. 3, each of the switching sections 305 and 307 receives an output signal of a corresponding control section 302 or 303, and selects and outputs one of the data q0, q1, q2 and q3 by using a starting column address.

Figure 5A:
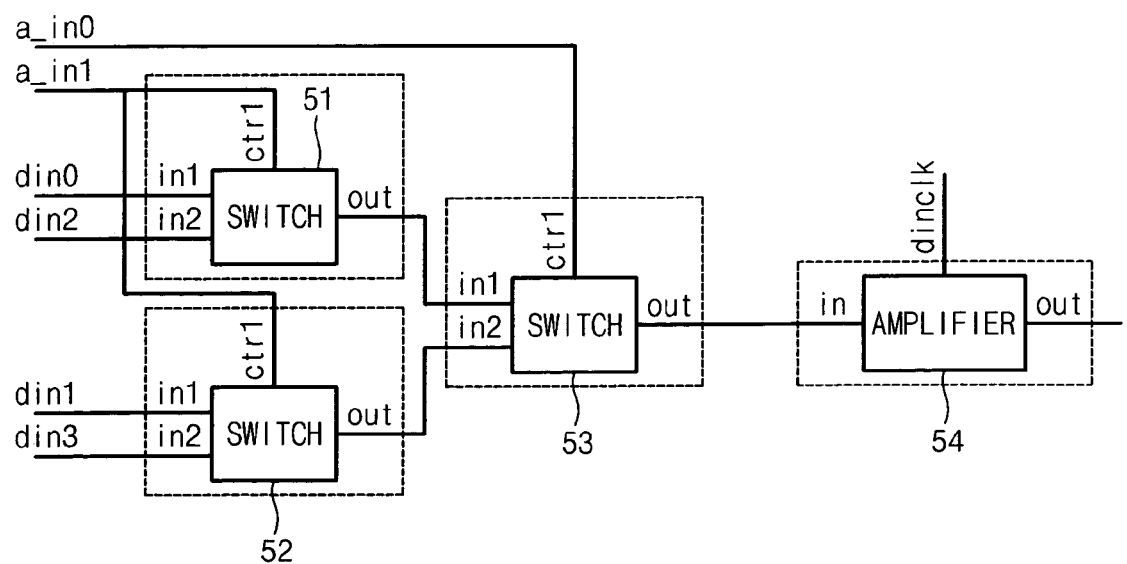
FIG. 5A is a block diagram illustrating a switching section shown in FIG. 3.
Figure 5B:
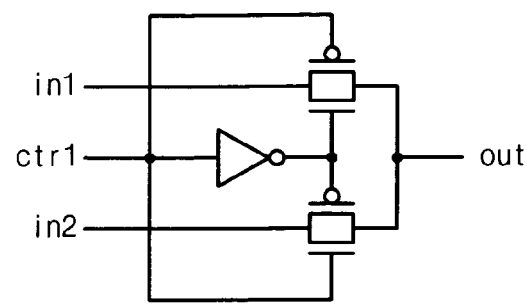
FIG. 5B is a circuit diagram illustrating a switch element shown in FIG. 5A.

FIG. 5A is a block diagram illustrating one of the switching sections 304 to 307 shown in FIG. 3, and FIG. 5B is a circuit diagram illustrating one of switch elements 51, 52 and 53 shown in FIG. 5A.

Since the operation of the switching section as shown in FIG. 5A is described above, an additional description thereof will be omitted. For reference, a clock signal dinclk applied to the switching section functions to determine a time point at which selected data is transferred to global input/output lines.

Figure 6:
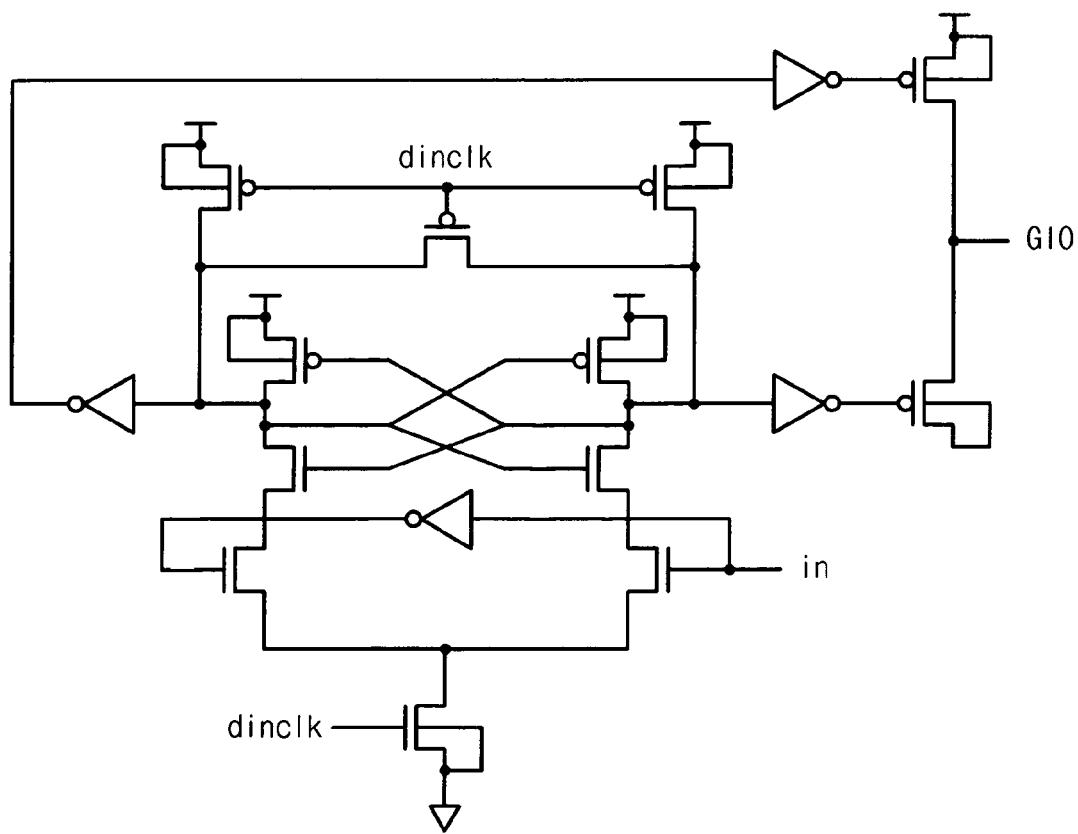
FIG. 6 is a circuit diagram illustrating an amplifier shown in FIG. 5A.

FIG. 6 is a circuit diagram illustrating an amplifier 54 shown in FIG. 5A. The amplifier shown in FIG. 6 is only an example, and those skilled in the art may use various amplification circuits to achieve the same function as that of the amplifier.

Also, FIGS. 4 to 6 show only examples of circuits for achieving the function of the data distribution section shown in FIG. 3. Those skilled in the art may use various types of circuits to achieve the same functions as those of circuits shown in FIGS. 4 to 6.

According to the method described with reference to FIG. 3 in the present invention, 4-bit data applied sequentially through one data pin are transferred to global input/output lines by using 4 control signals A1, A0, seq_intb and dinclk.

As described above, the present invention discloses a configuration for distributing input data to global input/output lines by using only four control signals A1, A0, seq_intb and dinclk.

According to an embodiment of the present invention, the number of control signals required in a device, which determines a distribution sequence of data inputted through one data pin, is reduced, thereby significantly reducing the layout area for disposition of control lines.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An input data distribution device for a memory device, the input data distribution device comprising:
   a decoding section being configured to receive a starting column address signal wherein the starting column address signal is carried by In(N)/In(2) address lines and the decoding section is configured to transmit N address decoded signals wherein each address decoded signal is carried by In(N)/In(2) address lines;
   N switching sections,
      each switching section is configured to receive a clock signal, and
      each switching section is configured to receive N bits of input data, wherein the N switching sections are subdivided into a first sub-group of N/2 switching sections and into a second sub-group of N/2 switching sections,
         each switching section in the first sub-group is configured to receive one of the address decoded signals transmitted from the decoding section,
         each switching section in the second sub-group is configured to receive only part of one of the address decoded signals from the decoding section; and
   N/2 control sections,
      each control section is configured to receive a burst determination signal wherein the burst determination signal corresponds to either a sequential mode or an interleaving mode,
      each control section is configured to receive one of the address decoded signals, and
      each control section is configured to output a control signal to one of the switching sections of the second sub-group in response to the burst determination signal and in response to one of the address decoded signals, wherein
         each switching section of the first sub-group is configured to exclusively output one bit from among N bits of a coded input/output data signal in response to one of the address decoded signals and in response to the clock signal, wherein
         each switching section of the second sub-group is configured to exclusively output one bit from among the N-bits of the coded input/output data signal in response to the control signal, in response to one of the address decoded signals, and in response to the clock signal, and wherein the input data distribution device requires at most the clock signal, the burst determination signal and the starting column address signal to coordinate a data distribution operation of transferring the N bits of input data into N bits of input/output data to the memory device.

2. The input data distribution device of claim 1, wherein output nodes of the switching sections correspond one-to-one to global input/output lines of the memory device, and a disposition sequence of the N bits of the coded input/output data signal transferred through the global input/output lines is determined by a combination of the starting column address signal, the clock signal, and the burst determination signal.

3. The input data distribution device of claim 1 wherein each switching section has an amplifier operatively coupled to each switching section.

4. The input data distribution device of claim 1 wherein each switching section has a plurality of switching elements operatively interconnected together and an amplifier operatively coupled to one of the switching elements.

* * * * *